(12) United States Patent
Bo et al.

(10) Patent No.: US 10,902,921 B2
(45) Date of Patent: Jan. 26, 2021

(54) FLASH MEMORY BITCELL ERASE WITH SOURCE BIAS VOLTAGE

(71) Applicant: TEXAS INSTRUMENTS INCORPORATED, Dallas, TX (US)

(72) Inventors: Xiang-Zheng Bo, Plano, TX (US); Vijaya Subramaniam Vemuri, Dallas, TX (US); Corey Rollin O'Brien, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/230,778

(22) Filed: Dec. 21, 2018

(65) Prior Publication Data

US 2020/0202946 A1 Jun. 25, 2020

(51) Int. Cl.
*G11C 11/34* (2006.01)
*G11C 16/16* (2006.01)
*H01L 27/11517* (2017.01)
*G11C 16/04* (2006.01)
*G11C 16/30* (2006.01)

(52) U.S. Cl.
CPC .......... *G11C 16/16* (2013.01); *G11C 16/0416* (2013.01); *G11C 16/30* (2013.01); *H01L 27/11517* (2013.01)

(58) Field of Classification Search
USPC ................................................... 365/185.29
See application file for complete search history.

(56) References Cited

U.S. PATENT DOCUMENTS

| | | | | |
|---|---|---|---|---|
| 5,268,319 A | * | 12/1993 | Harari | G11C 11/5621 438/260 |
| 5,636,160 A | * | 6/1997 | Omino | G11C 16/16 365/185.02 |
| 6,181,607 B1 | * | 1/2001 | Lee | G11C 16/0425 365/185.05 |
| 6,195,291 B1 | * | 2/2001 | Dallabora | G11C 5/147 365/185.23 |
| 6,222,774 B1 | * | 4/2001 | Tanzawa | G11C 16/08 365/185.2 |
| 6,240,027 B1 | | 5/2001 | Lee et al. | |
| 6,335,243 B1 | * | 1/2002 | Choi | H01L 27/11517 438/257 |
| 6,480,414 B1 | * | 11/2002 | Lin | G11C 11/5621 365/185.03 |

(Continued)

OTHER PUBLICATIONS

Lee et al., "A 45-nm logic compatible 4Mb-split-gate embedded flash with 1M-cycling-edurance," 2014 IEEE 6th International Memory Workshop (IMW), Taipei, 2014, pp. 75-77.

(Continued)

*Primary Examiner* — Viet Q Nguyen
(74) *Attorney, Agent, or Firm* — Andrew R. Ralston; Charles A. Brill; Frank D. Cimino

(57) ABSTRACT

In some examples, a flash memory comprises a first gate and a second gate located over a semiconductor substrate a third gate located between the first gate and the second gate a floating gate located between the third gate and the semiconductor substrate; and a doped region located within the semiconductor substrate and proximate the second gate, wherein the doped region is configured to receive a positive bias voltage with respect to the semiconductor substrate during an erase cycle.

26 Claims, 9 Drawing Sheets

(56) References Cited

U.S. PATENT DOCUMENTS

| | | | | |
|---|---|---|---|---|
| 6,747,310 B2* | 6/2004 | Fan | H01L 27/11521 | 257/316 |
| 6,901,006 B1* | 5/2005 | Kobayashi | G11C 16/0416 | 257/314 |
| 7,718,488 B2* | 5/2010 | Chen | H01L 27/115 | 438/257 |
| 7,868,375 B2* | 1/2011 | Liu | H01L 29/42328 | 257/320 |
| 8,669,607 B1* | 3/2014 | Tsair | H01L 29/7881 | 257/316 |
| 8,890,232 B2* | 11/2014 | Tsair | H01L 29/42328 | 257/316 |
| 9,691,883 B2* | 6/2017 | Chen | H01L 29/7883 | |
| 10,496,236 B2* | 12/2019 | Kakinuma | B60K 35/00 | |
| 10,720,217 B1* | 7/2020 | Tran | G11C 11/54 | |
| 2003/0218920 A1* | 11/2003 | Harari | H01L 27/115 | 365/200 |
| 2004/0100826 A1* | 5/2004 | Cho | G11C 16/10 | 365/185.28 |
| 2004/0145951 A1* | 7/2004 | Yang | G11C 16/14 | 365/185.29 |
| 2005/0207225 A1* | 9/2005 | Chen | H01L 27/115 | 365/185.17 |
| 2009/0201744 A1* | 8/2009 | Chern | G11C 16/16 | 365/185.33 |
| 2010/0290292 A1* | 11/2010 | Tanizaki | G11C 16/10 | 365/185.22 |
| 2011/0006355 A1* | 1/2011 | Shen | H01L 29/40114 | 257/316 |
| 2013/0223148 A1* | 8/2013 | Seo | H01L 27/04 | 365/185.11 |
| 2015/0091073 A1* | 4/2015 | Li | H01L 29/7881 | 257/316 |
| 2015/0131387 A1* | 5/2015 | Jeon | G11C 16/08 | 365/185.29 |
| 2016/0027517 A1* | 1/2016 | Kim | G11C 16/14 | 365/185.33 |
| 2016/0056250 A1* | 2/2016 | Chuang | H01L 29/42344 | 257/326 |
| 2016/0293260 A1* | 10/2016 | Tran | G11C 16/12 | |
| 2017/0110194 A1* | 4/2017 | Tiwari | G11C 16/12 | |
| 2018/0151580 A1* | 5/2018 | Wu | H01L 29/66825 | |
| 2019/0067305 A1* | 2/2019 | Shih | H01L 29/7831 | |
| 2019/0260363 A1* | 8/2019 | Kashihara | G11C 16/0466 | |
| 2020/0075614 A1* | 3/2020 | Huang | G11C 16/0416 | |

OTHER PUBLICATIONS

Lee et al., "A 45-nm logic compatible 4Mb-split-gate embedded flash with 1M-cycling-edurance," 2014 IEEE 6th International Memory Workshop (IMW), Taipei, 2014, pp. 1-4. [Online] http://ieeexplore.ieee.org/stamp/stamp.jsp?tp=&arnumber=6849369&isnumber=6849345.

* cited by examiner

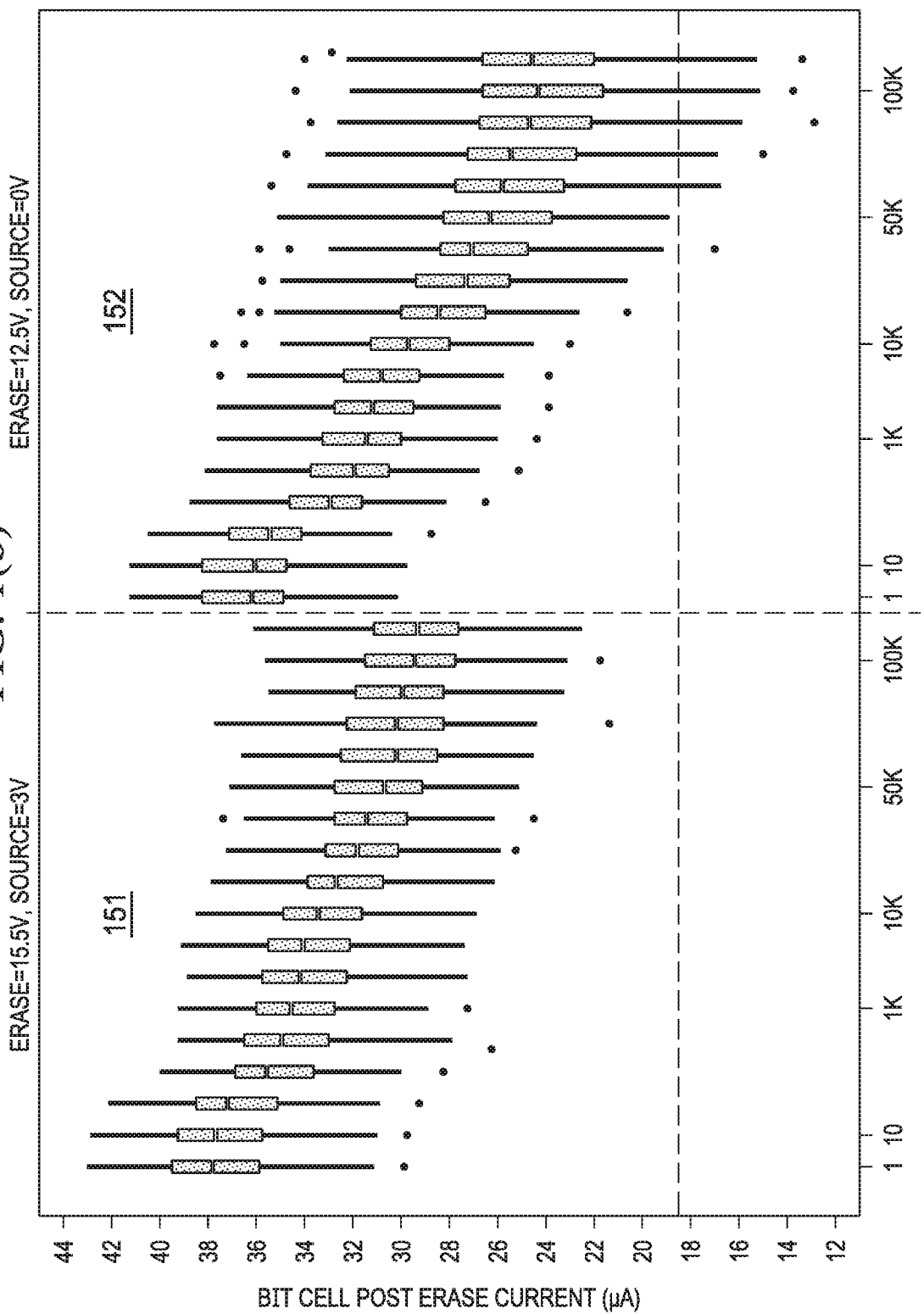

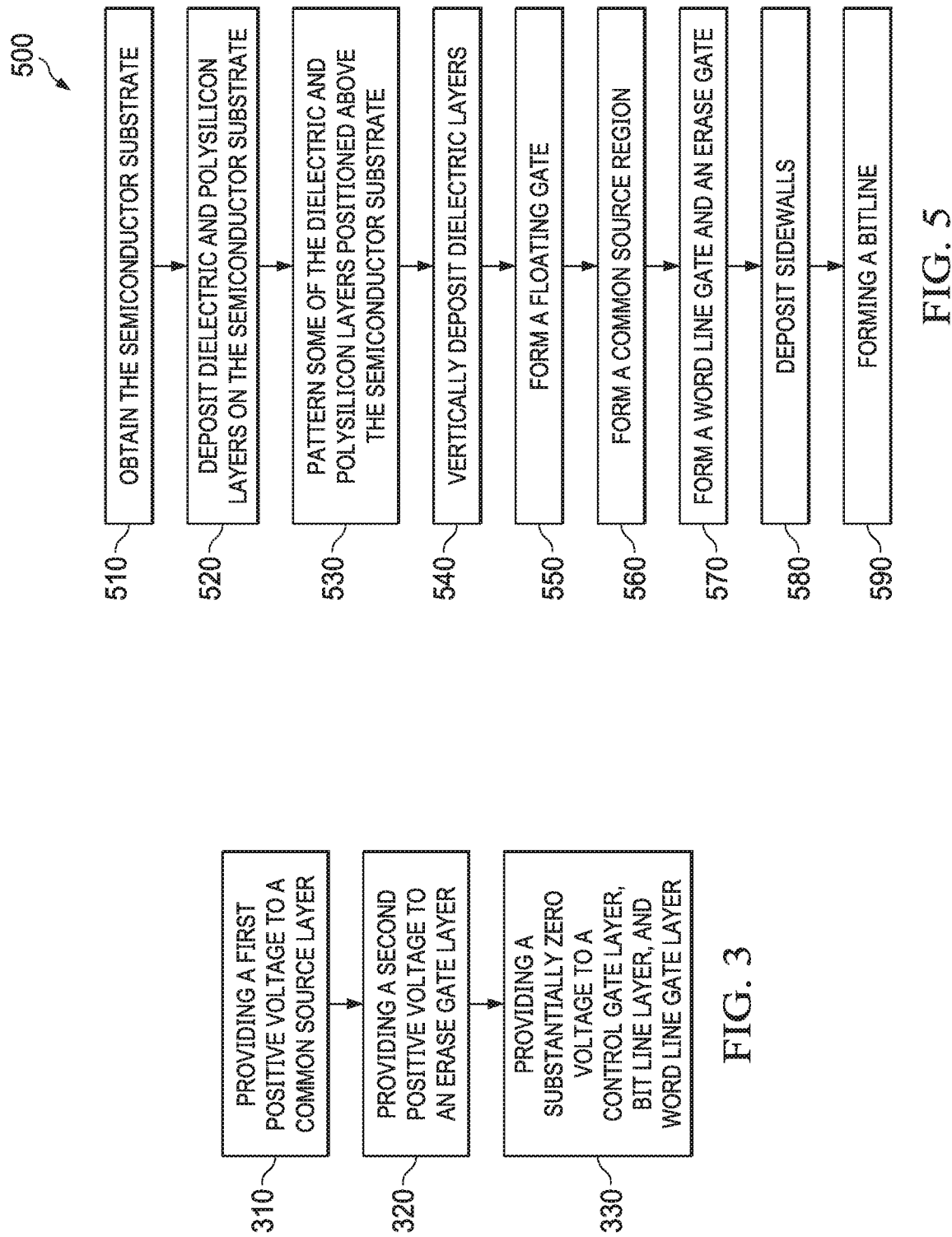

US 10,902,921 B2

FLASH MEMORY BITCELL ERASE WITH SOURCE BIAS VOLTAGE

BACKGROUND

A non-volatile-memory (NVM) bitcell is an electronic element that is configured to store information. The electrical state (e.g., threshold voltage) of a bitcell can be used to define a logic level such as a logic low level (meaning digital low or 0) or a logic high level (meaning digital high or 1). This defined logic level may sometimes be referred to as information (or a bit) stored in the bitcell.

SUMMARY

In accordance with at least some examples, a flash memory comprises a first gate and a second gate located over a semiconductor substrate a third gate located between the first gate and the second gate a floating gate located between the third gate and the semiconductor substrate; and a doped region located within the semiconductor substrate and proximate the second gate, wherein the doped region is configured to receive a positive bias voltage with respect to the semiconductor substrate during an erase cycle.

In accordance with at least some examples, a method of forming an integrated circuit comprises forming a source region within a semiconductor substrate; forming a wordline gate and an erase gate over a semiconductor substrate, the erase gate is proximate to the source region. The method may also include disposing a control gate between the wordline gate and the erase gate; forming a floating gate located between the control gate and the semiconductor substrate; and configuring the source region to receive a positive bias voltage with respect to the semiconductor substrate during an erase cycle.

In accordance with some examples, a method comprises providing a first positive voltage to a source region of a flash memory bitcell, the source region being located within a semiconductor substrate, and the first positive voltage being with respect to the substrate; providing a second positive voltage with respect to the substrate to an erase gate of the flash memory bitcell. The method further comprises maintaining the first and second positive voltages for sufficient duration to discharge a floating gate of the flash memory bitcell.

BRIEF DESCRIPTION OF THE DRAWINGS

For a detailed description of various examples, reference will now be made to the accompanying drawings in which:

FIG. 1(b) depicts illustrative graphs comparing a modified erase technique with a standard erase technique, in accordance with various examples.

FIG. 3 depicts an illustrative modified erase technique, in accordance with various examples.

FIG. 5 depicts a method to form an illustrative bitcell, in accordance with various examples.

DETAILED DESCRIPTION

Figure 1A:
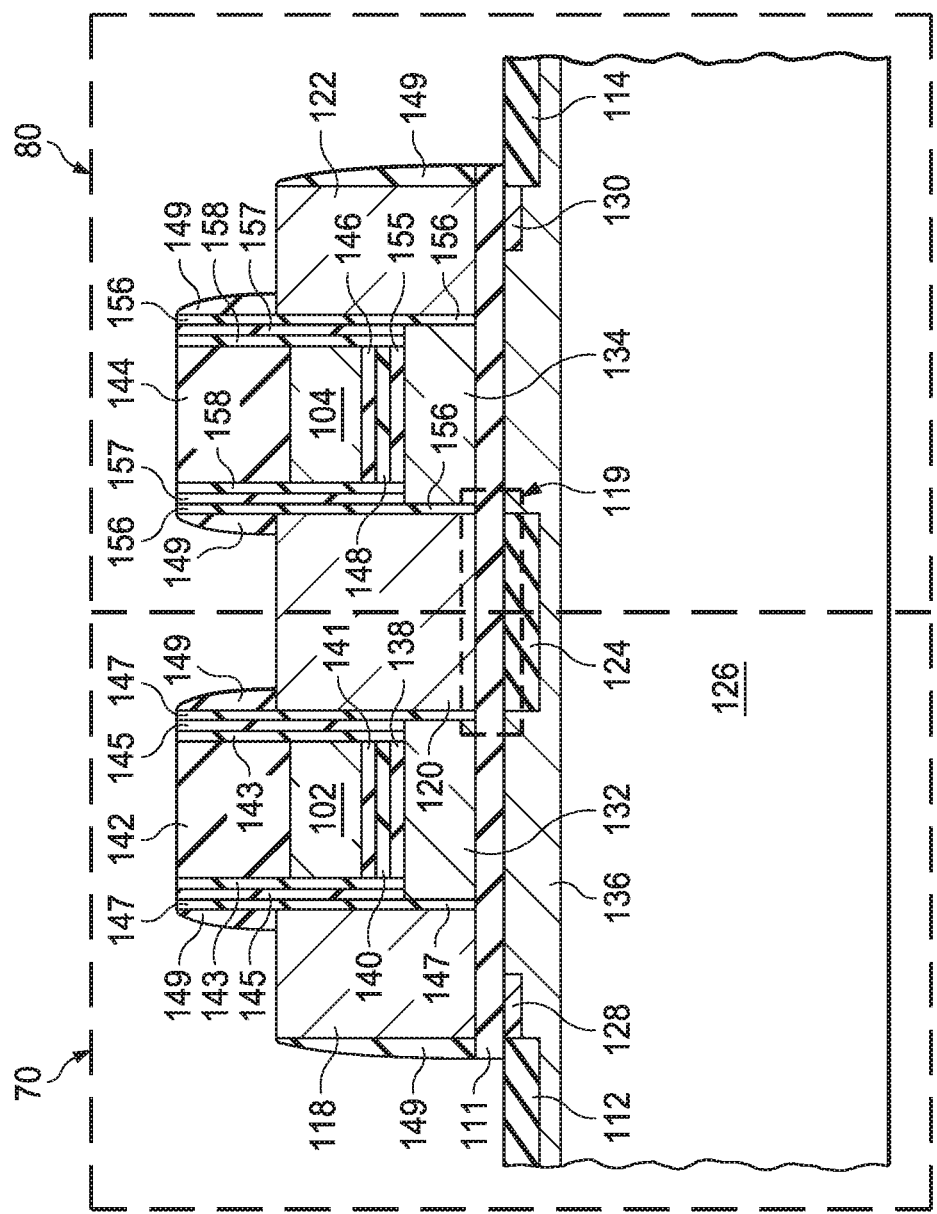
FIG. 1(a) depicts a side-view cross-section of a pair of illustrative bitcells, in accordance with various examples.

Flash memory is a non-volatile storage medium that may store information in an array of bitcells. This stored information (or "bits") can be electrically erased, programmed, and read. In some cases, an array of floating-gate transistor bitcells may be used in flash memory. A floating-gate transistor bitcell resembles a standard metal-oxide-field-effect-transistor (MOSFET) except that the floating-gate transistor bitcell includes multiple gates (e.g., control gate and floating gate). As noted above, an electrical state of a bitcell can be used to define a logic level, which can be referred to as a bit stored in the bitcell. This may be performed using changes in the floating gate of the bitcells. The threshold voltage of a floating-gate type transistor bitcell may change because of the presence or absence of a charge trapped in its floating gate. The trapped charge alters the threshold voltage (relative to the unchanged threshold voltage) of the floating-gate transistor bitcell. The threshold voltage (or the electrical state of the floating-gate transistor bitcell), when electrons are trapped in the floating-gate type transistor bitcell, can be characterized as a digital low or "0" stored as a bit in the bitcell. On the contrary, the electrical state, when electrons are depleted in the floating gate, can be referred to as a digital high or "1" stored as a bit in the bitcell.

In some cases, the floating-gate transistor bitcell utilizes split-gate architecture to store bits. Such a bitcell is typically referred to as split-gate Flash bitcell, and includes more than one transistor. For example, the split-gate Flash memory bitcell has a portion of the floating gate beneath the control gate, and a portion of a wordline transistor beside the control gate, such that the channel of the memory cell transistor is controlled by the wordline, which operates as a gate, as well as the floating gate. This causes the split-gate Flash memory bitcell to act as two transistors operating in serial, equivalent to 1.5 transistors (1.5T) per cell, where two Flash bitcells share a source or a drain. Similarly, in some configurations, the split-gate Flash bitcell can have a 2T (two transistors) configuration. A combination of one or more of these gates can be configured to program, erase, and read the split-gate bitcell.

Example split-gate Flash bitcell architecture includes a source line, a bitline, a control gate, a wordline, a floating gate, and an erase gate. Such bitcell architecture is sometimes referred to as third-generation SuperFlash technology (ESF3) bitcell architecture, and bitcells using ESF3 bitcell architecture are referred to as ESF3 bitcells. The ESF3 bitcell is typically programmed by injecting hot-electrons into its floating gate, which is done by applying a voltage potential with respect to a semiconductor substrate, for instance, approximately 0.5 V to the word-line gate, 10.5 V to the control gate, and 4.5 V to both a common source (which is shared by two bitcells) and the erase gate. Also, the same ESF3 bitcell can be erased, which is typically done, for instance, by applying a voltage potential high enough (e.g., 12.5 V) to remove the floating gate electrons via quantum tunneling. This erase procedure may be referred to herein as a baseline or standard erase procedure or technique. In some cases, it is necessary to read the electrical state of the ESF3 bitcell. This is typically done by reading a current between the bitline and the common source. The reading current during an erase operation, is sometimes referred to as IR1 reading current.

Over time as the ESF3 bitcell is programmed and erased, for instance, after 10,000 cycles, the magnitude of the IR1 reading current degrades significantly, which ultimately affects (e.g., reduces) the design margins and yield of the ESF3 bitcell. This degradation is thought to be due to a charge-trap buildup in the tunnel oxide located between the erase gate and the floating gate. Therefore, an alternative design/technique that can alleviate this issue is needed.

Accordingly, at least some of the examples described in this disclosure are directed towards ESF3 bitcells and circuitry that are configured to provide, during an erase operation, a first positive voltage (e.g., voltage greater than 0) to the common source and a second positive voltage (e.g., voltage greater than 0) to the erase gate. In some examples, while the first and second positive voltages are provided, the circuitry is configured to provide substantially zero volts (e.g., 0 V±0.2 V) to the control gate. In other examples, the circuitry may be configured to provide a voltage within a range between +10.0 V to −0.5 V.

Providing a positive bias to the common source allows the application of a higher voltage to the erase gate without increasing the electric field across a dielectric disposed between the erase gate and the common source. Alternatively, if no positive voltage was applied to the common source and only the voltage applied to the erase gate was increased, the resulting electric field between the erase gate and the common source in such a scenario may degrade or break down the dielectric disposed between the erase gate and the common source during erase cycles. It is found that the application of higher positive voltages to the erase gate improves the IR1 current in that the degradation of the IR1 current, while employing an erase technique consistent with the disclosure, is relatively less than the degradation of the IR1 current using the standard erase technique. The technique disclosed herein—which is sometimes herein referred to as a modified erase technique (or offset source erase technique)—may provide a larger number of program/erase cycles (e.g., a factor of 100 times greater in some implementations, or one million cycles) with relatively less degradation of the IR1 current. Such improvement is expected to improve the design margins and yield of the ESF3 bitcell. While examples described herein may be expected to provide improvements in bitcell device operation and/or reliability, no particular result is a requirement unless explicitly recited in a particular claim.

Referring now to FIG. 1(a), a side-view cross-section of a pair of illustrative ESF3 bitcells (hereinafter "bitcells") 70, 80 is shown. The bitcells 70 and 80 are substantially similar in structure. The bitcell 70 includes a bitline 112 that is disposed in a substrate 126 (also referred herein as a semiconductor substrate 126), e.g., a portion of silicon wafer. The bitcell 70 also includes a wordline (WL) 118, a control gate 102, a floating gate 132, and an erase gate 120 that is also shared by the bitcell 80. In some examples the wordline 118 may be referred to as a first gate, the erase gate may be referred to as a second gate, and the control gate 102 may be referred to as a third gate. The bitcell 70 further includes dielectric layers 138, 140, and 141. These dielectric layers are fabricated to provide vertical isolation between the control gate 102 and the floating gate 132. The bitcell 70, in some examples, also includes dielectric layers 143, 145, and 147 that provide horizontal isolation between the wordline 118 and control gate 102; and between the control gate 102 and erase gate 120. The dielectric layer 147 provides horizontal isolation between the wordline 118 and the floating gate 132, and between the floating gate 132 and the erase gate 120. In some examples, the dielectric layers 138, 141, 143, and 147 may include silicon dioxide, and the dielectric layers 140, 145 may include silicon nitride.

The bitcell 70 also includes a gate dielectric layer 111 that acts as the floating gate dielectric and provides isolation between the floating gate 132 and the substrate 126. FIG. 1(a) also depicts a dielectric layer 142 that provides vertical isolation of the control gate 102. The bitcell 70 forms a WL transistor that includes the wordline 118 (analogous to a gate of a MOSFET), the bitline 112 (analogous to a drain of a MOSFET), and a common source line 124 (analogous to a source of a MOSFET). Because the wordline 118 may operate as a gate with respect to the bitcell 70, the wordline 118 may sometimes be referred to equivalently as a wordline gate. The bitcell 70 also includes a doped extension region 128 of the bitline 112 that is disposed below the wordline 118 in the substrate 126. The doped extension region 128 may be considered to be analogous to a lightly-doped drain extension of a MOSFET. In some examples, the doped extension region 128 may be used to alter the threshold voltage of the WL transistor. In some examples, the substrate 126 also includes an additional doped region, such as a doped region 136, e.g., an anti-punch-through layer that is formed by implanting dopants (e.g., boron) in the substrate 126.

The control gate 102 is located between the wordline 118 and the erase gate 120. The floating gate 132 is located between the control gate 102 and the substrate 126, and the common source line 124 (also sometimes referred to as common source 124 or source region 124) is located within the substrate 126 and proximate (or below) the erase gate 120. The gate dielectric layer 111 isolates the erase gate 120 from the common source line 124.

Similar to the bitcell 70, the bitcell 80 includes a bitline 114, the common source line 124, the erase gate 120, a floating gate 134, a control gate 104, and a wordline 122. The bitcell 80 also includes dielectric layers 146, 148, and 155. These dielectric layers are fabricated to provide vertical isolation between the control gate 104 and the floating gate 134. The bitcell 80, in some examples, also includes dielectric layers 156, 157, and 158 that provide horizontal isolation between the wordline 122 and control gate 104; and control gate 104 and erase gate 120. The dielectric layer 157 provides horizontal isolation between the wordline 122 and the floating gate 134; and the floating gate 134 and the erase gate 120. In some examples, the dielectric layers 146, 155, 156, and 158 may include silicon dioxide, and the dielectric layers 148, 157 may include silicon nitride.

The bitcell 80 also includes dielectric 146, 148, which isolate the wordline 122, the control gate 104, the floating gate 134, and the erase gate 120 from each other. The bitcell 80 also includes the gate dielectric layer 111 that provides isolation between the floating gate 132 and the substrate 126. In some examples, the wordlines 118, 122, and control gates 102, 104, and the floating gates 132, 134 comprise polysilicon. The bitcell 80 also includes a doped region 130 that is disposed below the wordline 122 in the substrate 126. In some examples, both bitcells 70, 80 includes sidewalls 149 on the vertical edges of the wordlines 118, 122 and the dielectric layers 147, 156.

In some examples, bitcells 70, 80 may be fabricated in an integrated circuit (IC) (e.g., implemented in a semiconductor die that includes additional circuit(s)). In other examples, bitcells 70, 80 may be fabricated as a standalone device, for instance, implemented in a semiconductor die that includes an array of bitcells, such as bitcells 70, 80 and/or circuitry associated with it. For simplicity, FIG. 1(a) depicts a single pair of bitcells 70, 80. While some of the descriptions herein refer specifically to the bitcell 70, the described principles apply to the bitcell 80, and more generally to an array of bitcells employing bitcells such as bitcell 70/80.

As noted above, the electrical state of the bitcell 70 can be read in the erased state. This is done by reading the IR1 current between the bitline 112 and the common source line

124. As further noted above, the issue of degrading IR1 current during program/erase cycle may be found to be mitigated by using the modified erase technique. This technique includes applying a first positive voltage (e.g., voltage greater than 0 V) with respect to the voltage potential of the substrate 126 to the common source line 124; and applying a second greater positive voltage to the erase gate 120. (Unless stated otherwise, all voltages described herein are with respect to the substrate 126.) In some examples, during the erase cycle, along with the first and second positive voltages, the control gate 102, the wordline 118, and the bitline 112 may be held at a voltage potential substantially equal to zero volts. As used herein, the phrase "substantially zero volts" and similar phrases mean zero volts±0.2 V. In one example, applying substantially zero volts means applying precisely zero volts, e.g., 0 V±0.01 V, while in other examples, applying substantially zero volts means applying a voltage of, for example, 0.2 V. In other examples, during the erase cycle, along with the first and second positive voltages, substantially zero volts may be applied to the wordline 118 and the bitline 112, and a voltage ranging between +10.0 V to −0.5 V (with respect to the potential of the substrate 126) may be applied to the control gate 102. In other examples, during the erase cycle, the wordline 118 may be floating, meaning no voltage potential is applied to this gate.

Dielectric breakdown depends on the strength of the electric field interacting with the dielectric layer. Increasing the potential of the erase gate 120 alone while keeping the potential of the common source line 124 at substantially zero volts may result in the breakdown of a portion 119 of the gate dielectric layer 111 disposed between the erase gate 120 and the common source line 124. To reduce the electric field strength across the portion 119, the thickness of the gate dielectric layer 111 may be increased. However, increasing the dielectric thickness requires significant fabrication process and integration change, which may impact other bitcell performance specifications. Instead, the modified erase technique applies a positive bias at the common source line 124 such that the voltage on the erase gate 120 may be increased relative to baseline techniques without increasing the net electric field strength across the portion 119 of the gate dielectric layer 111. Thus the modified erase technique may provide increased reliability of the bitcell 70 without changing the physical dimensions of the various components of the bitcell 70, which could change other operating characteristics of the bitcell 70.

Referring now to FIG. 1(b), illustrative graphs 151 and 152 are shown comparing the modified erase technique with the standard erase technique, respectively, (for up to 100,000 cycles). The x-axis depicts the number of program/erase cycles (hereinafter cycles) and the y-axis depicts the IR1 current measured. Each of the candlesticks in both the graphs 151, 152 shows the measured IR1 current after running a number of cycles (e.g., 1, 10, 1000, 10,000 cycles etc.). The real body of each of the candlesticks depicts IR1 value from a 32K mini-array flash bitcell. Both erase techniques were applied on a same-sized array of ESF3 bitcells to obtain the graphs 151, 152. As noted above, a bitcell is said to be erased when the electrons present in the floating gate are tunneled out of the floating gate via quantum tunneling. The standard erase technique includes—for example in bitcell 70—a voltage of 12.5 V applied to the erase gate 120 and substantially zero volts to the wordline 118, the common source line 124, and the control gate 102. The modified erase technique includes—for example in bitcell 70—applying a first positive voltage of 3 V, e.g. an offset or bias voltage, to the common source line 124, a second positive voltage of 15.5 V to the erase gate 120, substantially zero volts to the wordline 118 and the control gate 102. A magnitude of the second positive voltage is greater than a magnitude of the first positive voltage, such that a potential difference between the erase gate 120 and the floating gate 132 is greater than a potential difference between the common source line 124 and the floating gate 132. As is observed from the graphs 151, 152, the candlesticks tend to follow—going from left-to-right—a downward trend, meaning that the IR1 current decreases as the number of cycles increases. When the current required to erase a bitcell becomes too low, that bitcell will no longer reliably store information.

Referring briefly to graph 151, after 1 cycle, the measured median IR1 current is approximately 38 uA; after 10,000 cycles, the measured median IR1 current is approximately 34 uA; after 100,000 cycles, and the measured median IR1 current is approximately 29 uA. Now referring briefly to the graph 152, after 1 cycle, the measured median IR1 current is approximately 37 uA; after 10,000 cycles, the measured median IR1 current is approximately 28.5 uA; after 100,000 cycles, and the measured median IR1 current is approximately 25 uA. It can be clearly observed from the graphs 151, 152 that the modified erase technique has higher IR1 currents as compared to the IR1 currents measured using traditional erase techniques for up to 100,000 cycles.

Figure 2:
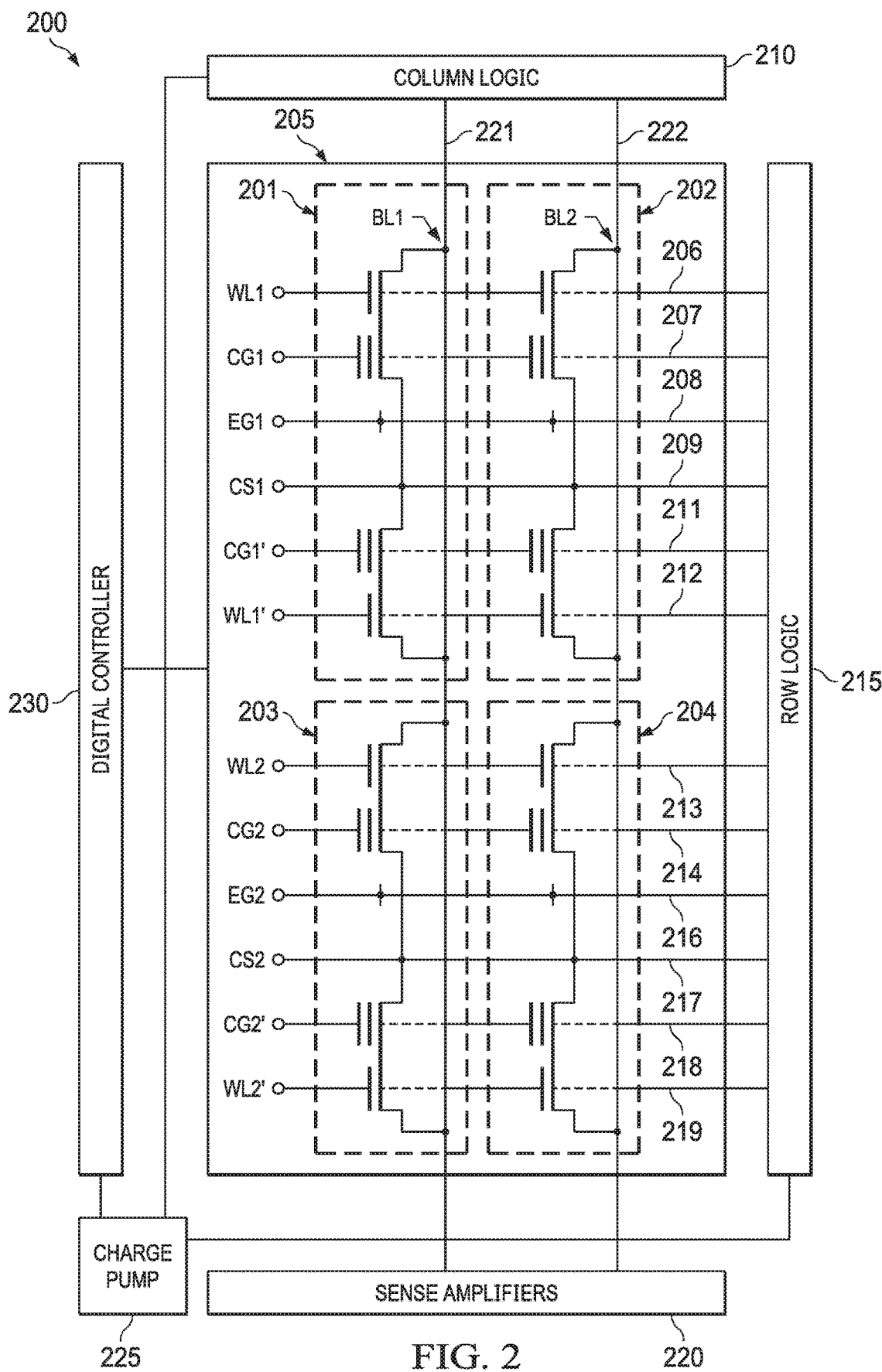
FIG. 2 depicts an illustrative bitcell array system, in accordance with various examples.

Referring now to FIG. 2, an illustrative bitcell array system 200 is shown that is configured to provide the modified erase technique (or modified erase cycle). The bitcell array system 200 includes a bitcell array 205, a row logic circuitry (hereinafter "row logic") 215, a column logic circuitry (hereinafter "column logic") 210, sense amplifiers 220, a bitcell array controller (hereinafter "digital controller") 230, and a charge pump circuitry (hereinafter "charge pump") 225. A bitcell array, in some examples, includes multiple bitcells coupled in series and in parallel. For example, the bitcell array 205 includes bitcells 201, 203 coupled in series, and bitcells 202, 204 also coupled in series. The series-coupled bitcells 201, 203 are coupled to the series coupled bitcells 202, 204 in parallel, such that the bitcells 201 and 202 are parallel-connected, and the bitcells 203, 204 are parallel-connected. Some of the terminals of the parallel-connected bitcells are electrically coupled to each other, and are further coupled to the row logic 215. For instance: wordlines of the bitcells 201, 202 are coupled to each other at a terminal WL1, which is coupled to the row logic 215 via a wire 206; control gates of the bitcells 201, 202 are coupled to each other at a terminal CG1, which is coupled to the row logic 215 via a wire 207; erase gates of the bitcells 201, 202 are coupled to each other at a terminal EG1, which is coupled to the row logic 215 via a wire 208; common sources of the bitcells 201, 202 are coupled to each other at a terminal CS1, which is coupled to the row logic 215 via a wire 209; the other set of control gates of the bitcells 201, 202 are coupled to each other at a terminal CG1', which is coupled to the row logic 215 via a wire 211; the other set of wordlines of the bitcells 201, 202 are coupled to each other at a terminal WL1', which is coupled to the row logic 215 via a wire 212.

Similarly, in the case of bitcells 203, 204, the wordlines of the bitcells 203, 204 are coupled to each other at a terminal WL2, which is coupled to the row logic 215 via a wire 213; control gates of the bitcells 203, 204 are coupled to each other at a terminal CG2, which is coupled to the row logic 215 via a wire 214; erase gates of the bitcells 203, 204 are coupled to each other at a terminal EG2, which is coupled to the row logic 215 via a wire 216; common sources of the bitcells 203, 204 are coupled to each other at a terminal CS2, which is coupled to the row logic 215 via a wire 217; the other set of control gates of the bitcells 203, 204 are coupled to each other at a terminal CG2', which is coupled to the row logic 215 via a wire 218; the other set of wordlines of the bitcells 203, 204 are coupled to each other at a terminal WL2', which is coupled to the row logic 215 via a wire 219.

The bitcell array 205 is grouped in bitcell blocks (not expressly shown in FIG. 2), and a bitcell block is often the minimum unit for erase operation. A bitcell erase operation, in some examples, is a mass operation in that all the bitcells of the selected block(s) will receive the erase pulses and go through erase operation together. In some examples, the blocks within bitcell array system 200 can be integrated within one or more integrated circuits, as desired, and external circuitry can be utilized as well. The digital controller 230, in some examples, includes a processing unit (not expressly shown in FIG. 2), and storage (e.g., RAM (random-access memory), ROM (read-only memory)), which may include any suitable type of non-transitory computer-readable medium storing machine-executable instructions. The machine-executable instructions, when executed by the processing unit, cause the processing unit to perform one or more of the actions attributed herein to the digital controller 230.

The charge pump 225 is configured to generate the different bias voltages applied to the bitcell array 205 during the bitcell operations. Thus in general the charge pump 225 is a voltage source. Those skilled in the pertinent art will appreciate that a charge pump includes a DC-to-DC converter that uses capacitors for energetic charge storage, and may provide an output voltage that is higher than an input voltage. While a charge pump may have particular utility in the illustrated example, other types of voltage source that do not rely on charge pumping may be used in some other examples. For the example depicted, the charge pump 225 generates the bias voltage used by row and column logic 215, 210, respectively, to provide appropriate voltage bias to the bitcell array 205. The charge pump 225, in some examples, is configured to receive control signals from the digital controller 230 that control the bias voltages being generated by the charge pump 225. The voltages generated by the charge pump 225 are adjusted or controlled based upon the bitcell operations being performed by the bitcell array system 200. As indicated above, bitcell operations can include read operations, program operations, erase operations, and/or other desired bitcell operations. The charge pump 225 can generate multiple different voltage levels, as needed, depending upon the bitcell operation being performed. Further, the charge pump 225 can be implemented as a single circuit block or as circuit blocks distributed in different locations throughout the bitcell array system 200.

In some examples, to perform the modified erase technique, first the bitcells to be erased are accessed. The following description refers concurrently to features of FIG. 2, and FIG. 3 which shows a method in one example. For the sake of simplicity, assume that the bitcells 201, 202, 203, and 204 are being erased. For this operation, the digital controller 230 provides row addresses of the bitcells 201-204 to the row logic 215 and column addresses of the bitcells 201-204 to the column logic 210 and sense amplifiers 220. The row logic 215 drives rows within the bitcell array 205 based upon the row addresses by applying a first positive voltage, e.g., 3 V, to CS1 and CS2 (step 310, FIG. 3); a second positive voltage, e.g., 15.5 V, to EG1 and EG2 (step 320, FIG. 3); and substantially zero volts to WL1, CG1, CG1', WL1', WL2, CG2, CG2', WL2' (step 330, FIG. 3). In some examples, the method depicted in FIG. 3 further includes maintaining the first and second positive voltages for sufficient duration (e.g., 10 milliseconds) to discharge electrons present in floating gates of the bitcells 201, 202, 203, and 204. The column logic 210 couples to the bitlines BL1, BL2 via the wires 221, 222, respectively. In some examples, the first and second positive voltages may be chosen based on the thickness of the portion 119 of the gate dielectric layer 111 disposed between the erase gate 120 and the common source line 124 (FIG. 1a). In examples where the portion 119 can withstand an electric field corresponding to 12.5 V, the difference between the first and second positive voltages is limited to 12.5 V. Therefore, the first positive voltage can be other values as well, e.g., the first positive voltage being 2.5 V and the second positive voltage being 14.5 V, amongst other values. Similarly, in examples where the portion 119 can withstand a higher voltage potential (and its corresponding electric field), e.g., 14 V, the first and second positive voltages can be a difference of two positive voltages that is substantially equal to 14 V. For instance, the first positive voltage (bias voltage) is 3 V and the second positive voltage is 17 V, making their difference equal to 14 V.

Referring now to FIG. 5, an illustrative method 500 for fabricating the bitcell 70 is shown. In some examples, the method 500 may be performed to form an integrated circuit including the bitcell 70. The method 500 is now described in tandem with FIGS. 4(a)-4(f), which depict illustrative cross-sectional diagrams of the step-by-step fabrication process of the bitcell 70. As described below in detail, various fabrication processes may be employed to fabricate the bitcell 70, and these fabrication processes, in some examples, include deposition, etching, implantation, photolithography, annealing, and other suitable processes.

Figure 4B:
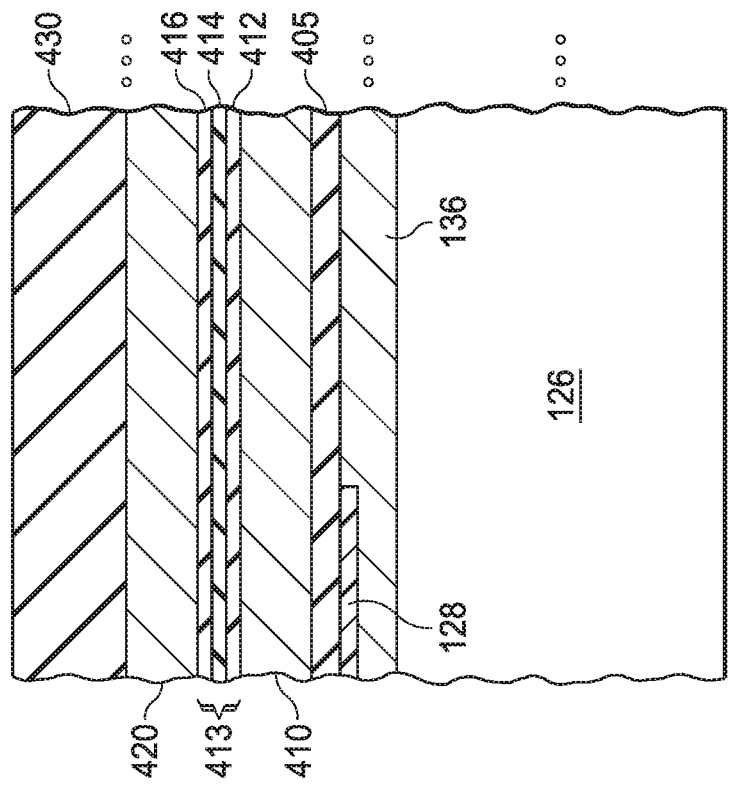
FIGS. 4(a)-4(j) depict step-by-step fabrication of an illustrative bitcell, in accordance with various examples.
Figure 4A:
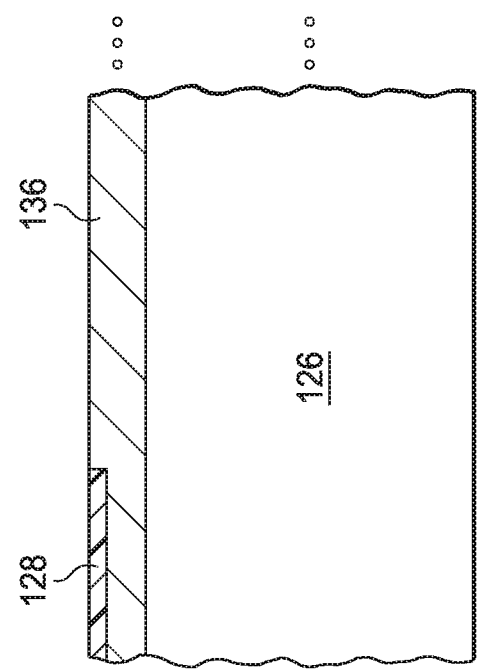

The method 500 begins with a step 510 that includes obtaining the semiconductor substrate 126 having the doped layer 136 and doped extension region 128 (step 510; FIG. 4(a)). The semiconductor substrate 126, in some examples, predominantly includes silicon. In some examples, the doped region 136 is formed by doping the substrate 126 by implanting a p-type dopant, e.g., boron, and the doped extension region 128 may be formed by doping the substrate 126 by implanting an n-type dopant, e.g., phosphorus. Following the step 510, the method 500 proceeds to a step 520 (refer to FIG. 4(b)) that includes depositing various layers on/above the semiconductor substrate 126. For example, the step 520 includes depositing a dielectric layer 405 comprising silicon dioxide on the semiconductor substrate 126, e.g., by chemical vapor deposition (CVD). The step 520 further includes depositing a polysilicon layer 410 using, e.g., the CVD process, on the dielectric layer 405. A portion of the polysilicon layer 410 (as described in the method 500 below) subsequently forms the floating gate 132 of the bitcell 70. With continued reference to FIG. 4(b), the step 520 further includes depositing a dielectric layer 413 on the polysilicon layer 410 using, for example, the CVD process. The dielectric layer 413, in this example, comprises a tri-layer structure, which includes two dielectric layers 412, 416 that comprise silicon dioxide. The tri-layer structure of the dielectric layer 413 also includes a dielectric layer 414 that comprises silicon nitride. Still referring to FIG. 4(b), the step 520 further includes depositing another poly-silicon layer 420, e.g., by using the CVD process, on the dielectric layer 413. The polysilicon layer 420, as further described below, subsequently forms the control gate 102 of the bitcell 70. With continued reference to FIG. 4(b), the step 520 also includes depositing, e.g., using the CVD process, a dielectric layer 430 that includes, e.g., silicon nitride.

Figure 4D:
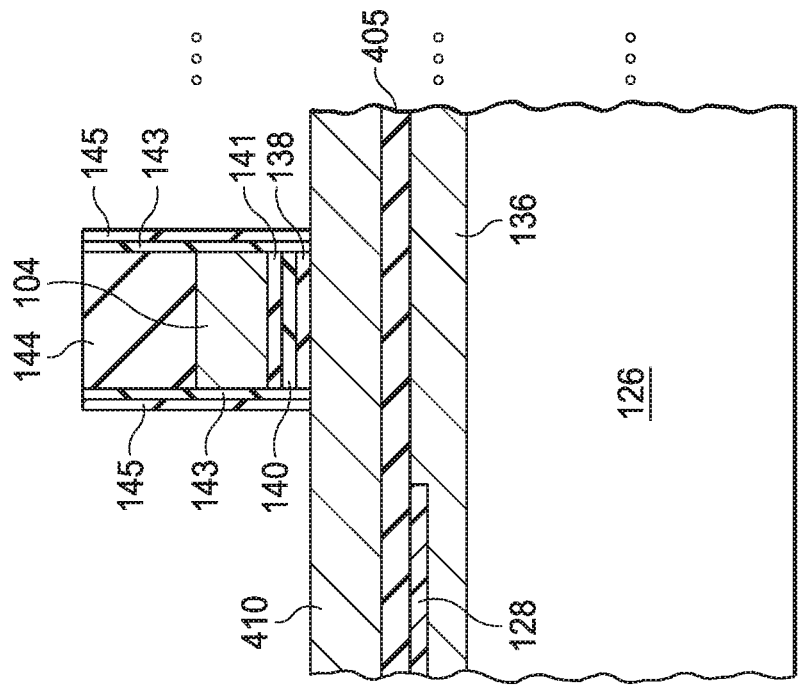
Figure 4C:
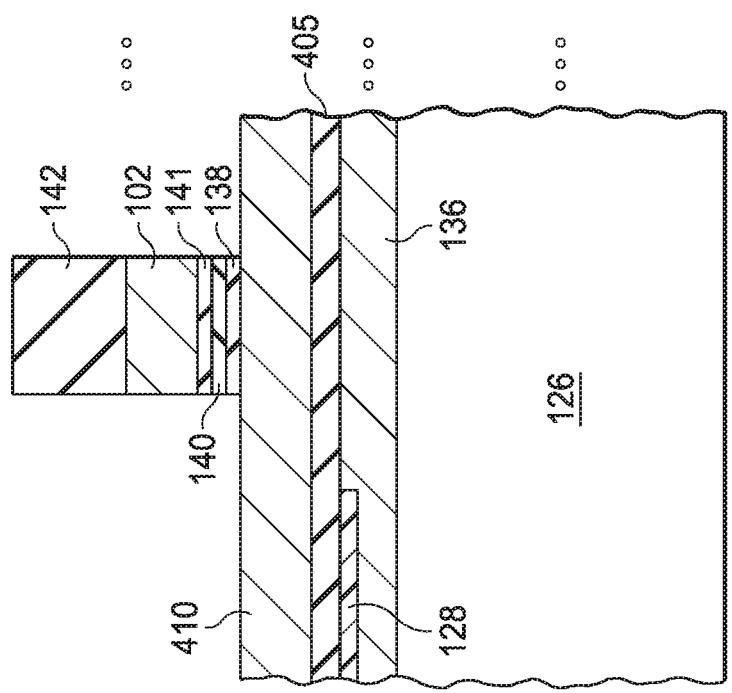

Following the step 520, the method 500 proceeds to a step 530 (see FIG. 4(c)) that includes patterning some layers that are disposed above the semiconductor substrate 126. For example, the step 530 includes patterning: the dielectric layer 430 (FIG. 4(b)) to form the dielectric layer 142 (FIG. 1(a)); the polysilicon layer 420 to form the control gate 104 (FIG. 1(a)); and the dielectric layers 412, 414, and 416 to form the dielectric layers 138, 140, 141, respectively (FIG. 1(a)). The patterning process of the step 530, in some examples, is performed using photo lithography and dry plasma etching techniques.

Following the step 530, the method 500 proceeds to a step 540 (see FIG. 4(d)), which includes vertically depositing the dielectric layers 143, 145 using the CVD process. The dielectric layers 143, 145 are deposited such that they are positioned on both the adjacent sides of the dielectric layers 138, 140, 141, 144, and the control gate layer 104. In some examples, the dielectric layers 143, 145 extend from the top of the dielectric layer 144 to the top of the polysilicon layer 410. In some examples, the dielectric layer 143 includes silicon dioxide and the dielectric layer 145 includes silicon nitride.

Figure 4F:
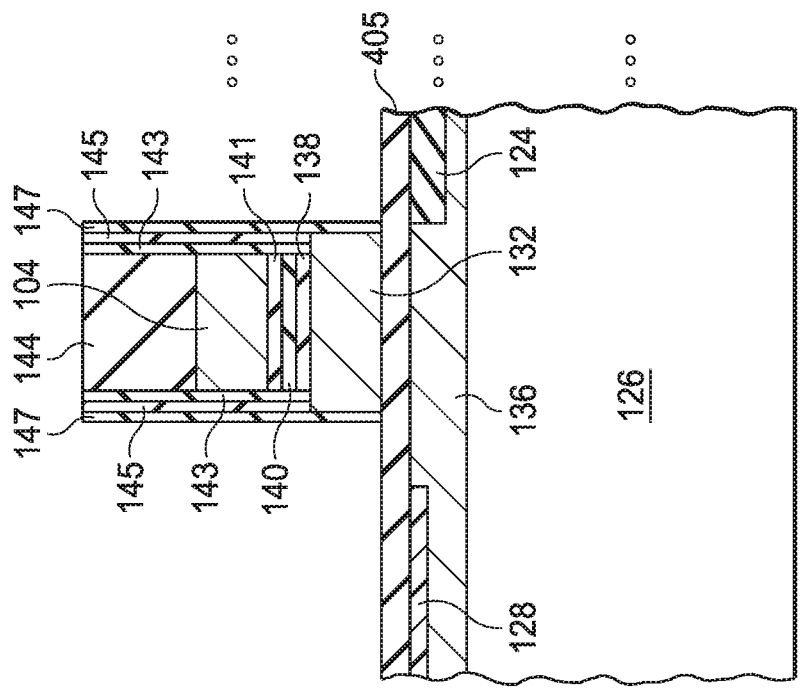
Figure 4E:
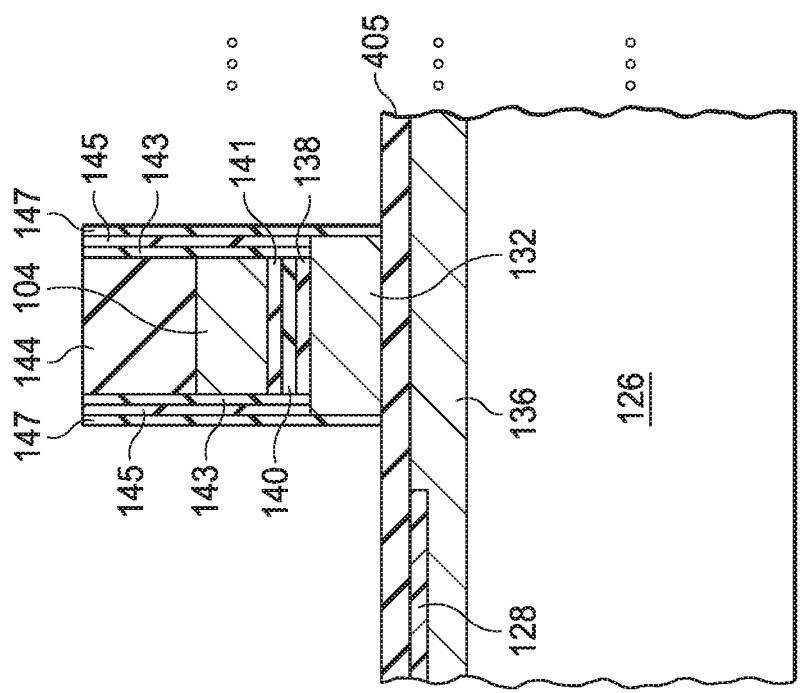

Following the step 540, the method 500 proceeds to a step 550 (see FIG. 4(e)) that includes forming the floating gate 132 (FIG. 1(a)) by patterning the polysilicon layer 410 (FIG. 4(d)). This patterning process may be performed using photo lithography and dry plasma etching techniques. After forming the floating gate 132, the dielectric layer 147 is deposited by using the CVD process on both the adjacent sides of the dielectric layers 138, 140, 141, 144, and the control gate layer 104. The dielectric layer 147 extends from the top of the dielectric layer 144 to the top side of the dielectric layer 405. The dielectric layer 147, in some examples, includes silicon dioxide and is deposited to provide horizontal isolation between the floating gate 132 and the gates (e.g., erase gate 120 and wordline 118) that will be formed in the subsequent steps.

Figure 4G:
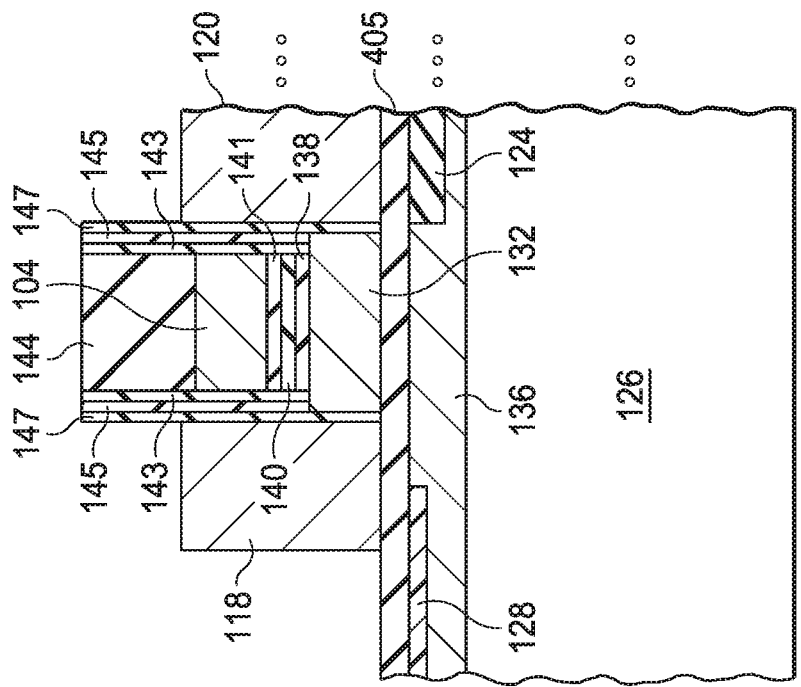
Figure 4H:
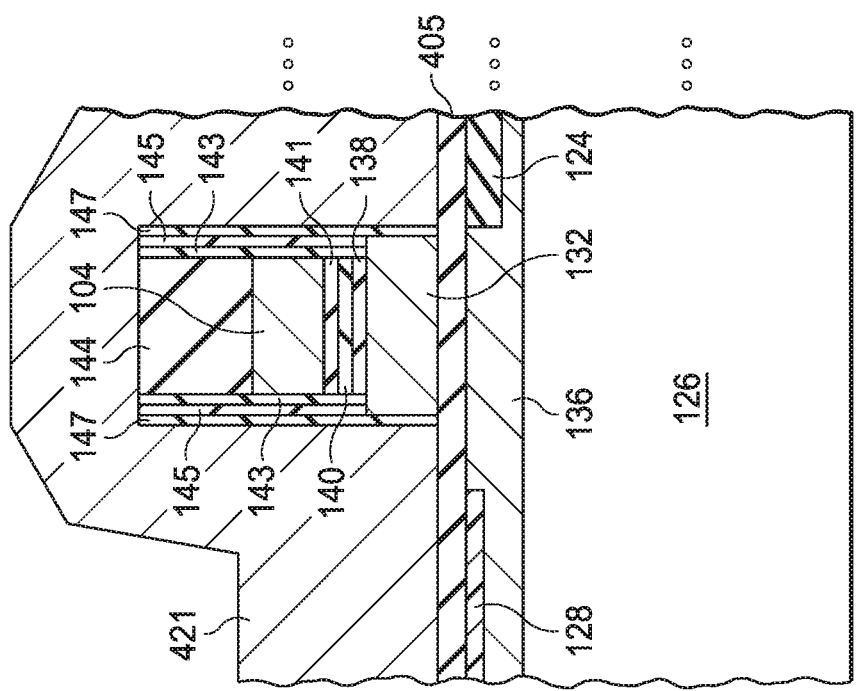
Figure 4I:
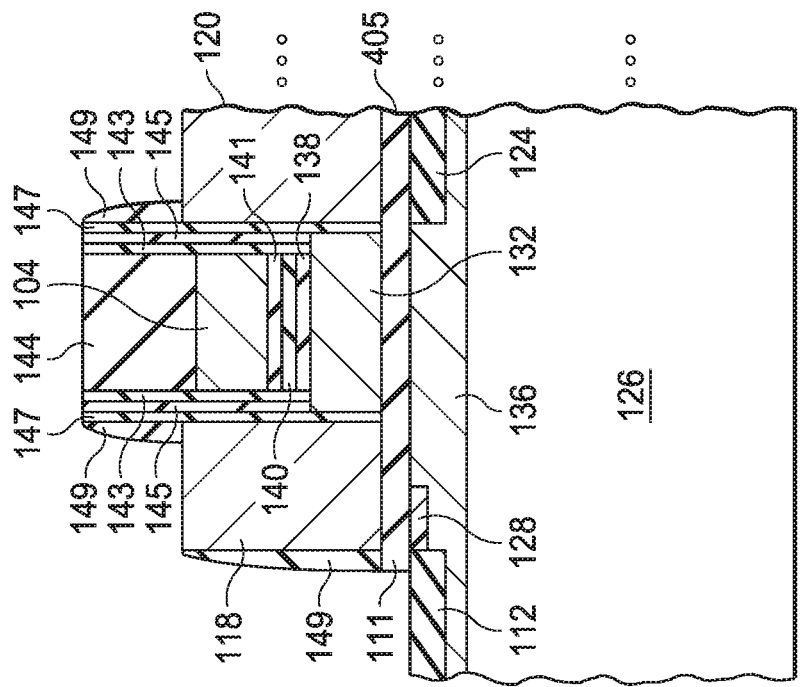
Figure 4J:
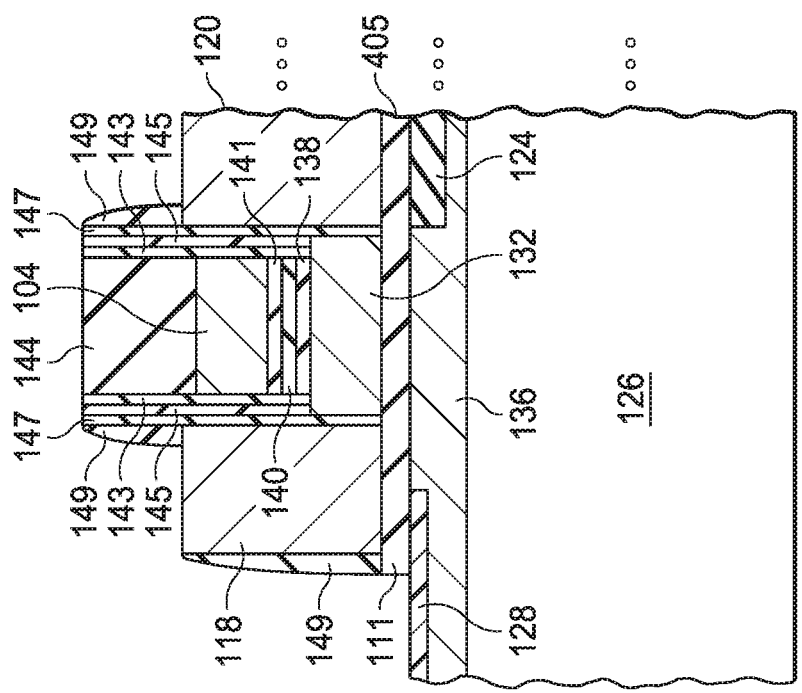

Following the step 550, the method 500 proceeds to a step 560 (see FIG. 4(f)) that includes forming the common source region 124 by implanting, using ion implantation, n-type dopants, e.g., phosphorus, into the semiconductor substrate 126. Following the formation of the common source region, the method 500 then proceeds to a step 570 (see FIG. 4(g)) that includes forming the wordline 118 and the erase gate 120. The step 570 first includes depositing using the CVD process a polysilicon layer 421 on top of the dielectric layers 143, 144, 145, 147, and 405. The polysilicon layer 421 also vertically deposits on the sides of the dielectric layer 147. The step 570 then includes (see FIG. 4(h)) patterning some portions of the polysilicon layer 421 (FIG. 4(g)) to form the wordline 118 and the erase gate 120. This patterning process, in some examples, is performed using photo lithography and dry plasma etching techniques. In some examples a blanket polysilicon etch may be used without patterning. Following the step 570, the method 500, in some examples, includes depositing sidewalls 149 (step 580; FIG. 4(i)) on the vertical edges of the wordline 118 and the dielectric layer 147, e.g. by deposition of a SiN layer followed by blanket etch. The method 500 then proceeds to a step 590 (see FIG. 4(j)) that includes forming the bitline 112 by implanting n-type dopants, e.g., phosphorus, into the semiconductor substrate 126 to form the bitline 112.

The modified erase condition technique described above may be applied to the bitcell 70 fabricated using the method 500 described above. For example, the common source region 124 may receive a first positive bias voltage during an erase cycle and the erase gate may receive a second greater positive bias voltage. Additionally, the control gate 104 may be configured to receive, during the erase cycle, a voltage that is about 0 V with respect to the semiconductor substrate 126. In some examples, during the erase cycle, the voltage applied to the control gate 104 may be within a range of about −10.0 V and about +0.5 V with respect to the semiconductor substrate 126.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A flash memory, comprising:
a first gate and a second gate located over a semiconductor substrate;
a third gate located between the first gate and the second gate;
a floating gate located between the third gate and the semiconductor substrate; and
a doped region located within the semiconductor substrate and proximate the second gate;
wherein the doped region is configured to receive a positive bias voltage with respect to the semiconductor substrate during an erase cycle, the positive bias voltage is about 3 V and the second gate is configured to receive a voltage of about 15.5 V with respect to the semiconductor substrate.

2. A flash memory, comprising:
a first gate and a second gate located over a semiconductor substrate;

a third gate located between the first gate and the second gate;

a floating gate located between the third gate and the semiconductor substrate; and a doped region located within the semiconductor substrate and proximate the second gate;

a first dielectric layer covering a sidewall of the third gate and stopping at a top surface the floating gate; and a second dielectric layer covering the first dielectric layer and a sidewall of the floating gate, wherein the doped region is configured to receive a positive bias voltage with respect to the semiconductor substrate during an erase cycle, and the second gate is configured to receive a voltage with respect to the semiconductor substrate that is greater than the positive bias voltage.

3. The flash memory of claim 2, wherein the doped region is configured to receive a positive bias voltage with respect to the semiconductor substrate during an erase cycle, and the positive bias voltage is about 3 V and the second gate is configured to receive a voltage of about 15.5 V with respect to the semiconductor substrate.

4. The flash memory of claim 2, wherein the third gate is configured to receive during the erase cycle a voltage of about 0 V with respect to the semiconductor substrate.

5. The flash memory of claim 2, wherein the third gate is configured to receive a voltage within a range between about −10.0 V and about +0.5 V with respect to the semiconductor substrate during the erase cycle.

6. The flash memory of claim 2, wherein the doped region is configured to receive a positive bias voltage with respect to the semiconductor substrate during an erase cycle, and a bitcell includes the first, second and third gates, the floating gate and the doped region, further comprising an array of bitcells, the doped region of each of the bitcells of the array being connected to a same terminal configured to provide the positive bias voltage during the erase cycle.

7. The flash memory of claim 2, wherein the first gate is a wordline gate, the second gate is an erase gate, the third gate is a control gate, and the doped region is a source region.

8. An integrated circuit, comprising:
the flash memory of claim 2; and
a voltage source configured to provide to the doped region a positive bias voltage with respect to the semiconductor substrate during an erase cycle.

9. The integrated circuit of claim 8, wherein the voltage source comprises a charge pump.

10. A method of forming an integrated circuit, comprising:
forming a source region within a semiconductor substrate;
forming a wordline gate and an erase gate over a semiconductor substrate, the erase gate is proximate to the source region;
disposing a control gate between the wordline gate and the erase gate;
forming a floating gate located between the control gate and the semiconductor substrate;
forming a first dielectric layer covering a sidewall of the control gate and stopping at a top surface the floating gate;
forming a second dielectric layer covering the first dielectric layer and a sidewall of the floating gate; and
configuring the erase gate to receive a voltage with respect to the semiconductor substrate that is greater than a positive bias voltage applied to the source region.

11. The method of claim 10, further comprising: configuring the control gate to receive during the erase cycle a voltage that is about 0 V with respect to the semiconductor substrate.

12. The method of claim 10, further comprising forming a voltage source over the semiconductor substrate, and configuring the voltage source to provide the positive bias voltage to the source region.

13. The method of claim 12, wherein the voltage source comprises a current pump.

14. The flash memory of claim 2, wherein the first and second dielectric layers are different materials.

15. The flash memory of claim 2, wherein the first dielectric layer comprises silicon nitride and the second dielectric layer comprises silicon dioxide.

16. The flash memory of claim 2, further comprising a third dielectric layer between the first dielectric layer and the third gate.

17. The flash memory of claim 16, wherein the first dielectric layer comprises silicon nitride and the second and third dielectric layers comprises silicon dioxide.

18. The flash memory of claim 2, further comprising a multilayer dielectric stack between the third gate and the floating gate, the multilayer dielectric stack including at least one layer of silicon dioxide and at least one layer of silicon nitride.

19. The flash memory of claim 10, wherein the first and second dielectric layers are different materials.

20. The flash memory of claim 10, wherein the first dielectric layer comprises silicon nitride and the second dielectric layer comprises silicon dioxide.

21. The flash memory of claim 10, further comprising a third dielectric layer between the first dielectric layer and the floating gate.

22. The flash memory of claim 21, wherein the first dielectric layer comprises silicon nitride and the second and third dielectric layers comprises silicon dioxide.

23. The flash memory of claim 10, further comprising a multilayer dielectric stack between the third gate and the floating gate, the multilayer dielectric stack including at least one layer of silicon dioxide and at least one layer of silicon nitride.

24. A method of forming an integrated circuit, comprising:
forming a source region within a semiconductor substrate;
forming a wordline gate and an erase gate over a semiconductor substrate, the erase gate is proximate to the source region;
disposing a control gate between the wordline gate and the erase gate;
forming a floating gate located between the control gate and the semiconductor substrate; and
configuring the source region to receive during an erase cycle a positive bias voltage of at least about 2.5 V with respect to the semiconductor substrate; and
configuring the erase gate to receive during the erase cycle a positive bias voltage of about 12.5 V with respect to the semiconductor substrate.

25. The method flash memory of claim 10, wherein the source region is configured to receive during the erase cycle a voltage of at least 2.5 V, and the erase gate is configure to receive during the erase cycle a voltage of at least 12.5 V.

26. The flash memory of claim 2, wherein the doped region is configured to receive during the erase cycle a voltage of at least 2.5 V, and the second gate is configure to receive during the erase cycle a voltage of at least 12.5 V.

* * * * *